US007557305B2

(12) United States Patent
Su et al.

(10) Patent No.: US 7,557,305 B2

(45) Date of Patent: Jul. 7, 2009

(54) CONNECTOR HOUSING FOR A SMALL AND PORTABLE TRANSMITTING-RECEIVING MODULE

(75) Inventors: Hou-An Su, Keelung (TW); Chin-Pao Wu, Taipei (TW)

(73) Assignee: Nextronics Engineering Corp., Taipei County (TW)

(*) Notice: Subject to any disclaimer, the term of this patent is extended or adjusted under 35 U.S.C. 154(b) by 0 days.

(21) Appl. No.: 12/222,883

(22) Filed: Aug. 19, 2008

(65) Prior Publication Data

US 2009/0114439 A1 May 7, 2009

Related U.S. Application Data

(63) Continuation-in-part of application No. 11/979,286, filed on Nov. 1, 2007, now abandoned.

(51) Int. Cl.
*H05K 9/00* (2006.01)

(52) U.S. Cl. ........................ 174/376; 174/382; 174/51; 439/607

(58) Field of Classification Search .................. 174/51, 174/350, 376, 382, 384; 361/816, 818, 800; 439/607

See application file for complete search history.

(56) References Cited

U.S. PATENT DOCUMENTS 6,351,394 B1 * 2/2002 Cunningham ............... 361/818
6,416,361 B1 * 7/2002 Hwang ....................... 439/607
6,469,906 B1 * 10/2002 Baltz et al. .................. 361/760
6,666,720 B1 * 12/2003 Reisinger et al. ............ 439/607
6,822,872 B2 * 11/2004 Schulz et al. .............. 361/747
7,001,217 B2 * 2/2006 Bright et al. ................ 439/609
7,037,136 B1 * 5/2006 Korsunsky et al. .......... 439/607
7,130,194 B2 * 10/2006 Togami et al. ............. 361/715
7,215,558 B2 * 5/2007 Schultz et al. ............. 361/816
7,242,586 B2 * 7/2007 Cheng et al. ............... 361/728
2006/0121794 A1 * 6/2006 Hanley et al. ............... 439/677
2006/0128218 A1 * 6/2006 Droesbeke et al. .......... 439/607
2006/0274518 A1 * 12/2006 Yu et al. ..................... 361/816

* cited by examiner

*Primary Examiner*—Hung V Ngo
(74) *Attorney, Agent, or Firm*—Rosenberg, Klein & Lee

(57) ABSTRACT

A connector housing for a small and portable transmitting-receiving module includes an upper housing and a lower housing. The upper housing has a top board, two side walls and a rear cover. The lower edge of the two side walls has a first wedging plate, first convex blocks, and first indentations. The lower housing has a bottom board, and the bottom board has a second wedging plate, second convex blocks, and second indentations. The second wedging plate is wedging the two side walls. The first wedging plate is wedging the bottom board. The second convex blocks are plugged into the first indentations. The first convex blocks are plugged into the second indentations. Thereby, the structure of the connector housing is stronger compared to the prior art. The housing is not easily deformed. Its structure is simple, and the manufacturing cost is reduced.

9 Claims, 6 Drawing Sheets

CONNECTOR HOUSING FOR A SMALL AND PORTABLE TRANSMITTING-RECEIVING MODULE

CROSS REFERENCE TO RELATED APPLICATION

This application is a continuation-in-part of U.S. application Ser. No. 11/979,286, filed on 1 Nov. 2007 and entitled "connector housing for a small and portable transmitting-receiving module", now abandoned.

BACKGROUND OF THE INVENTION

1. Field of the Invention

The present invention relates to a connector housing for a small and portable transmitting-receiving module. In particular, this invention relates to a connector housing for a small and portable transmitting-receiving module that is used for a high-speed data transmitting interface converter.

2. Description of the Related Art

The transmitting-receiving module provides a dual-directional data transmission between an electric interface and the Internet. The transmitting-receiving module receives an encoded signal, and converts the encoded signal into a decoded signal and transmits the decoded signal to the Internet. At the same time, the transmitting-receiving module also receives another encoded signal, and converts the encoded signal into an electric signal and transmits the electric signal to the electric interface.

Generally, the small and portable transmitting-receiving module connector is installed on the printed circuit board of the host, the input/output system, the peripheral equipment or the switchboard. The small and portable transmitting-receiving module connector is connected with the metal housing assembled on the printed circuit board. Reference is made to FIG. 1. The metal housing has two parallel side walls 1*a*, a rectangular top 2*a*, a rectangular bottom 3*a*, a rear cover 4*a*, and a side wall cover 5*a*. The two side walls 1*a*, the rectangular top 2*a*, the rectangular bottom 3*a* and the side wall cover 5*a* are formed into one piece. The two side walls 1*a* are located at the two sides of the rectangular top 2*a*. The rear cover 4*a* extends from the rear side of the rectangular top 2*a*. The rectangular bottom 3*a* is connected with the two side walls 1*a*. The rectangular bottom 3*a* is opposite to the rectangular top 2*a*. The side wall cover 5*a* extends from one side of the rectangular top 2*a*. The side wall cover 5*a* has a plurality of openings 51*a*. There are a plurality of wedging plates 11*a* on the side wall 1*a* that correspond to the openings 51*a*. The wedging plates 11*a* are engaged with the openings 51*a*. The metal housing provides a simple inner connection, and is easily installed on the printed circuit is board for eliminating the accumulated static charge, sheltering the EMI, and protecting the connector.

In order to reduce the manufacturing cost, the metal housing for fitting with the small and portable transmitting-receiving module connector is manufactured by a punching process. Although the manufacturing cost is reduced, it is difficult to control the dimensions accurately. Furthermore, except for the wedging plates 11*a* being engaged with the openings 51*a*, there is no other structure to enhance the connecting strength of the metal housing. Therefore, when the metal housing is installed on the printed circuit board, the metal housing may be deformed due to an improper assembling process or an external force. Thereby, the small and portable transmitting-receiving module cannot be installed into the metal housing, or the EMI sheltering effect is reduced.

SUMMARY OF THE INVENTION

One particular aspect of the present invention is to provide a connector housing for a small and portable transmitting-receiving module. The structure strength of the metal housing is enhanced. The metal housing is not easily deformed due to an improper assembling process or an external force. Its structure is simple, and the manufacturing cost is reduced.

The connector housing for a small and portable transmitting-receiving module includes an upper housing having a top board, two side walls and a rear cover, and a lower housing having a bottom board. The two side walls extend from the two opposite sides of the top board. The rear cover is connected with the two side walls. The lower edge of the two side walls has a first wedging plate, a plurality of first convex blocks, and a plurality of first indentations. At the two opposite sides of the bottom board, there are a second wedging plate, a plurality of second convex blocks,.and a plurality of second indentations. The second wedging plate leans against the first wedging plate. The second wedging plate is wedging the two side walls. The first wedging plate is wedging the bottom board. The second convex blocks are plugged into the first indentations. The first convex blocks are plugged into the second indentations. Each of the two opposite sides of the bottom board extends upwards to form at least one flexible plate. The interior of the flexible plate has an wedging unit. Each of the two side walls has at least one wedging hole. The wedging hole is engaged with the wedging unit. The lower edge of the two side walls have a plurality of needle-hole pins. A plurality of reinforcing ribs each straddles the side wall and the needle-hole pin.

The present invention has the following characteristics. Because the second wedging plate leans against the first wedging plate, the second wedging plate is wedging the two side walls, the first wedging plate is wedging the bottom board, the second convex blocks are plugged into the first indentations and the first convex blocks are plugged into the second indentations, the structure of the connector housing for a small and portable transmitting-receiving module is stronger. The housing is not easily deformed or damaged due to an improper-assembling process or an external force. Its structure is simple, and the manufacturing cost is reduced.

For further understanding of the invention, reference is made to the following detailed description illustrating the embodiments and examples of the invention. The description is only for illustrating the invention and is not intended to be considered limiting of the scope of the claim.

BRIEF DESCRIPTION OF THE DRAWINGS

The drawings included herein provide a further understanding of the invention. A brief introduction of the drawings is as follows.

DETAILED DESCRIPTION OF THE PREFERRED EMBODIMENTS

Figure 1:
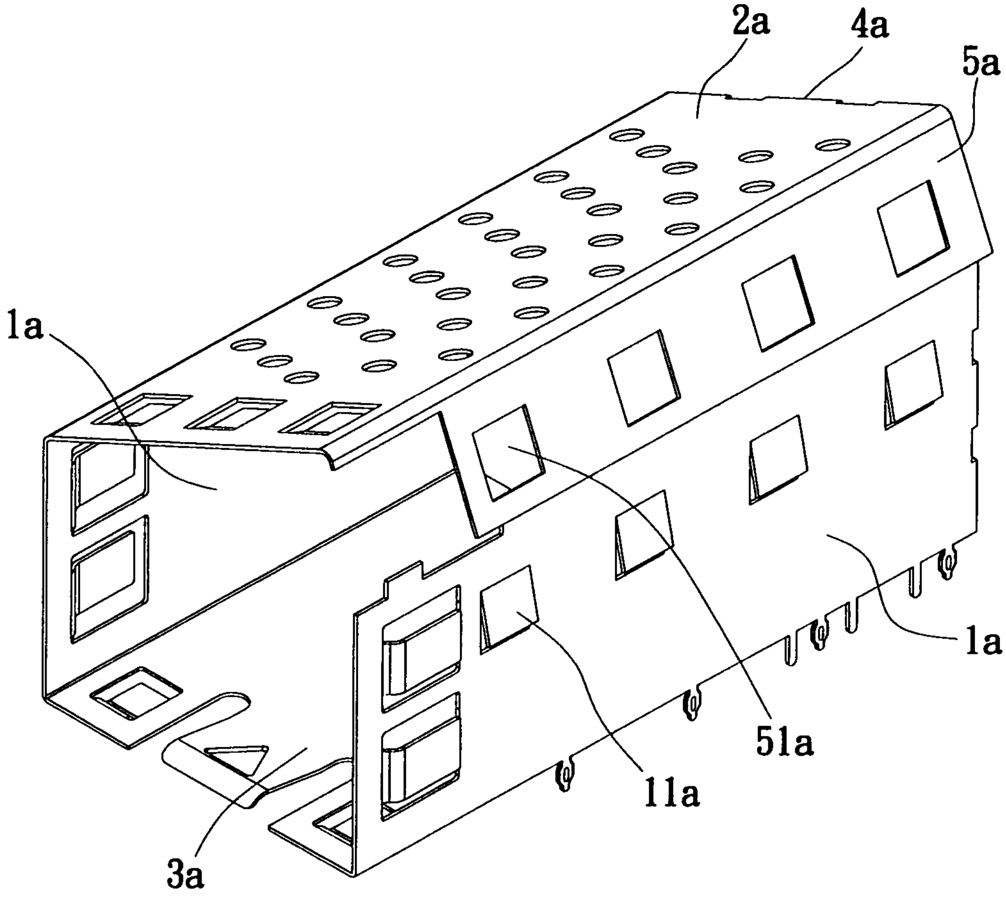
FIG. 1 PRIOR ART
FIG. 1 is a perspective view of the connector housing for a small and portable transmitting-receiving module of the prior art.

Reference is made to FIGS. 2~6. The connector housing for a small and portable transmitting-receiving module includes an upper housing 1, and a lower housing 2. The upper housing 1 is formed by bending a single metal board and has an inverted U-shape. The upper housing 1 has a top board 11, two side walls 12, a rear cover 13, and a plurality of first grounding flexible plates 14. The top board 11 is a rectangular metal board and has a plurality of cooling holes 111 for exhausting the heat from the small and portable transmitting-receiving module (not shown in the figure).

Figure 2A:
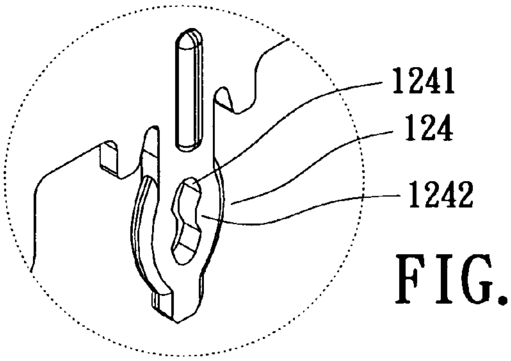
FIG. 2*a* is an enlarged perspective view of the needle-hole pin for a small and portable transmitting-receiving module of the present invention.
Figure 2:
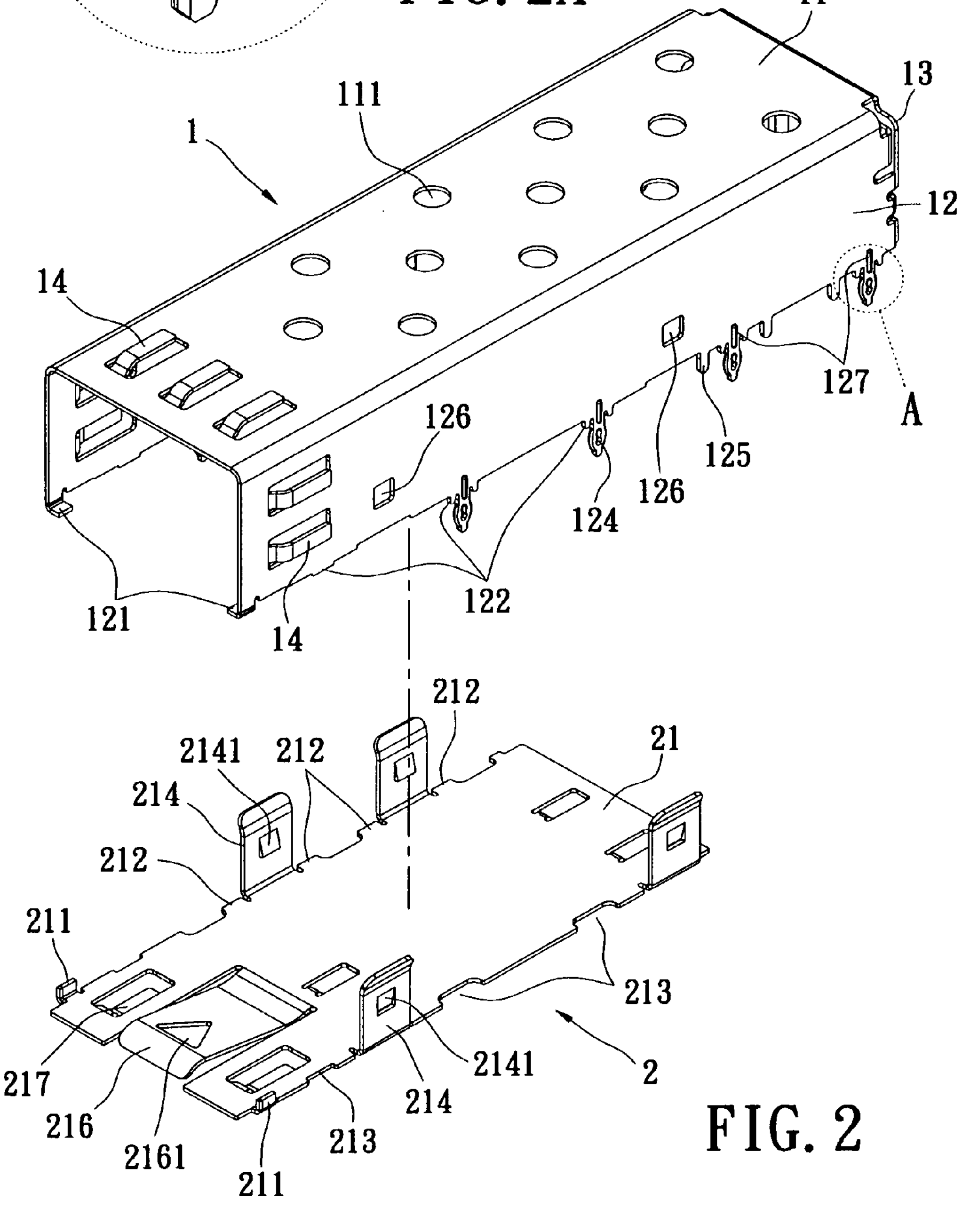
FIG. 2 is an exploded perspective view of the connector housing for a small and portable transmitting-receiving module of the present invention.
Figure 3:
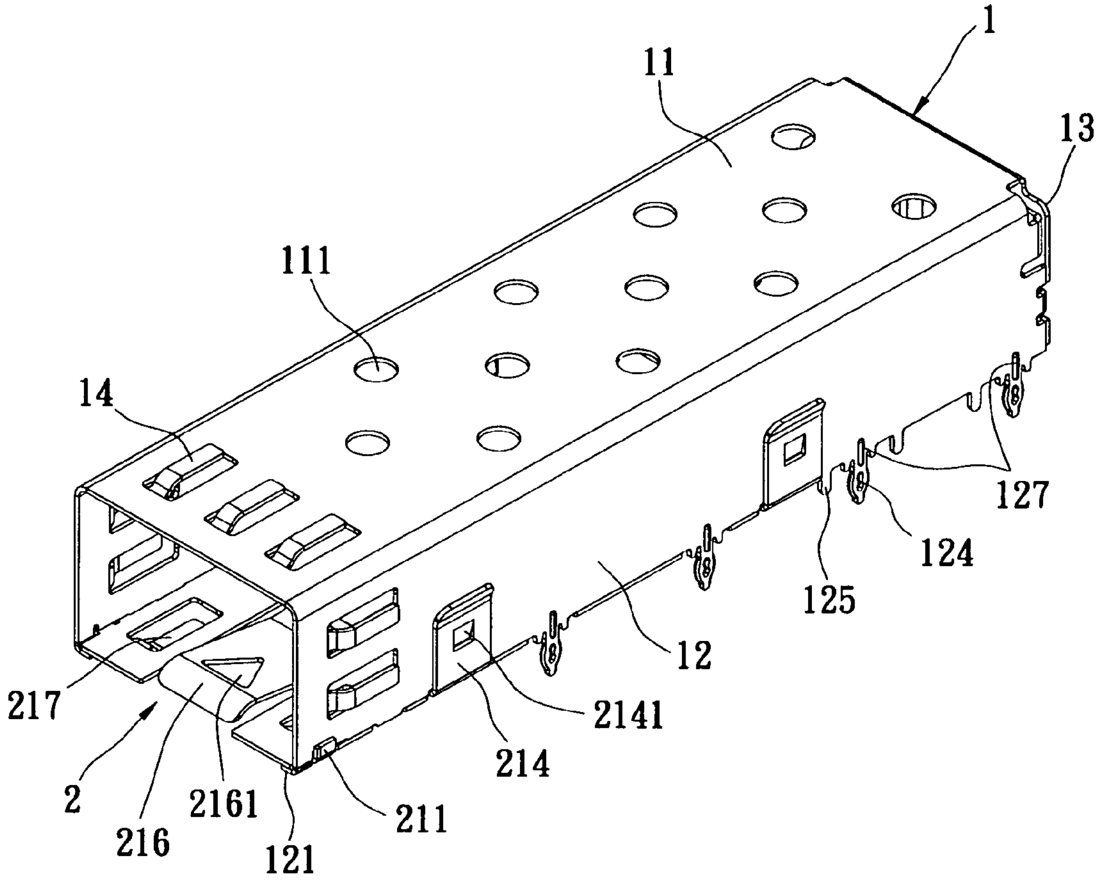
FIG. 3 is an assembly perspective view of the connector housing for a small and portable transmitting-receiving module of the present invention.
Figure 4:
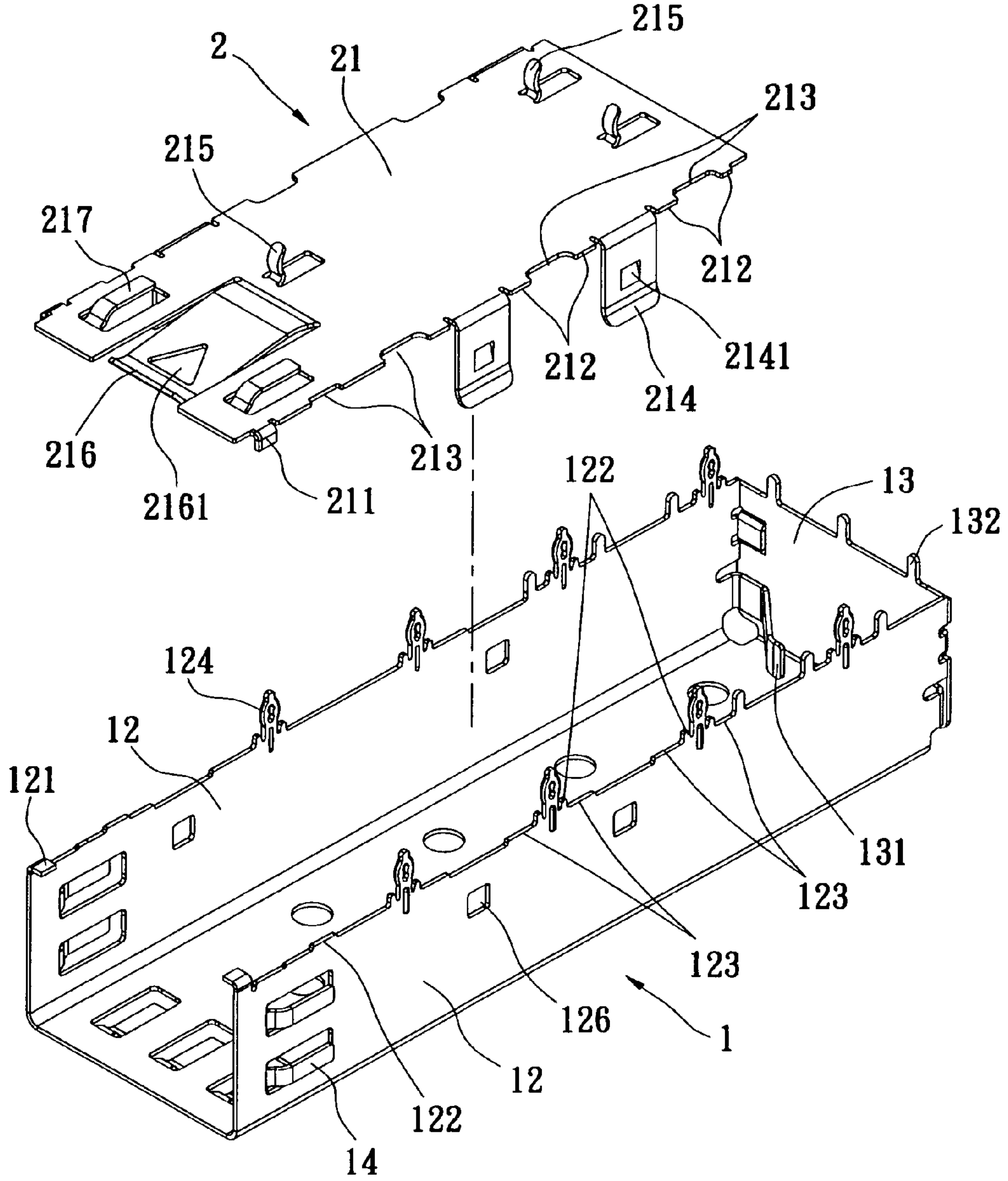
FIG. 4 is another exploded perspective view of the connector housing for a small and portable transmitting-receiving module of the present invention.
Figure 5:
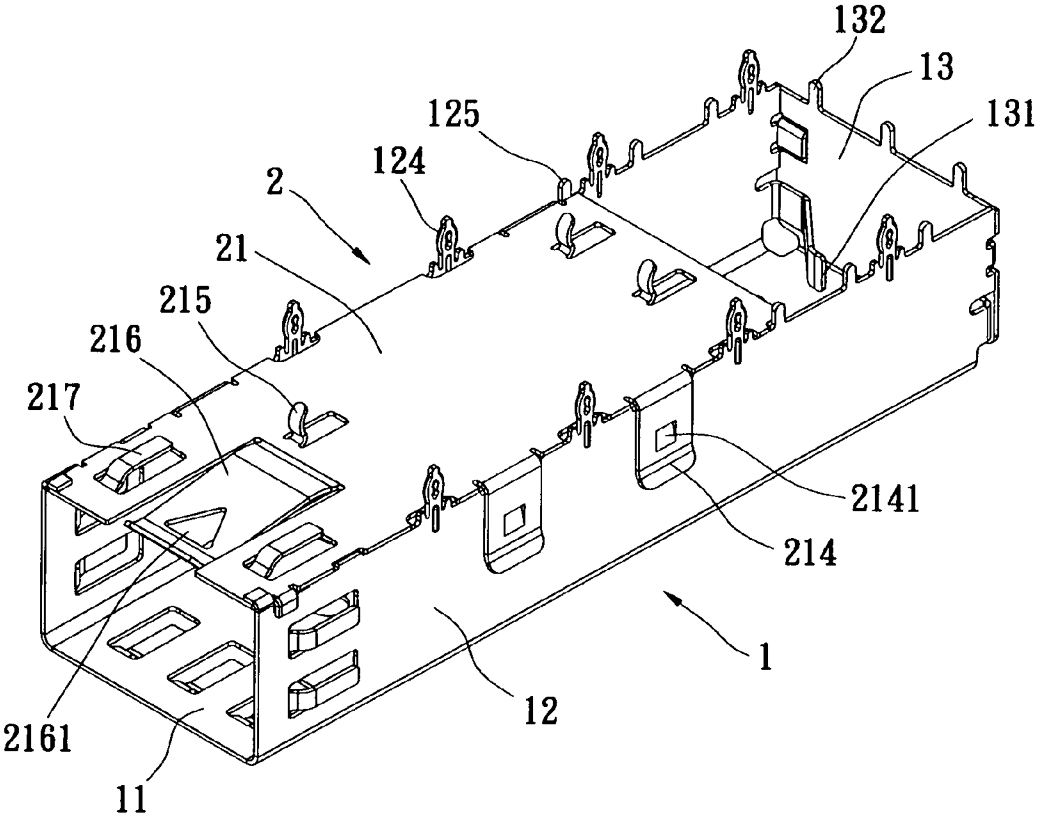
FIG. 5 is another assembly perspective view of the connector housing for a small and portable transmitting-receiving module of the present invention.
Figure 6:
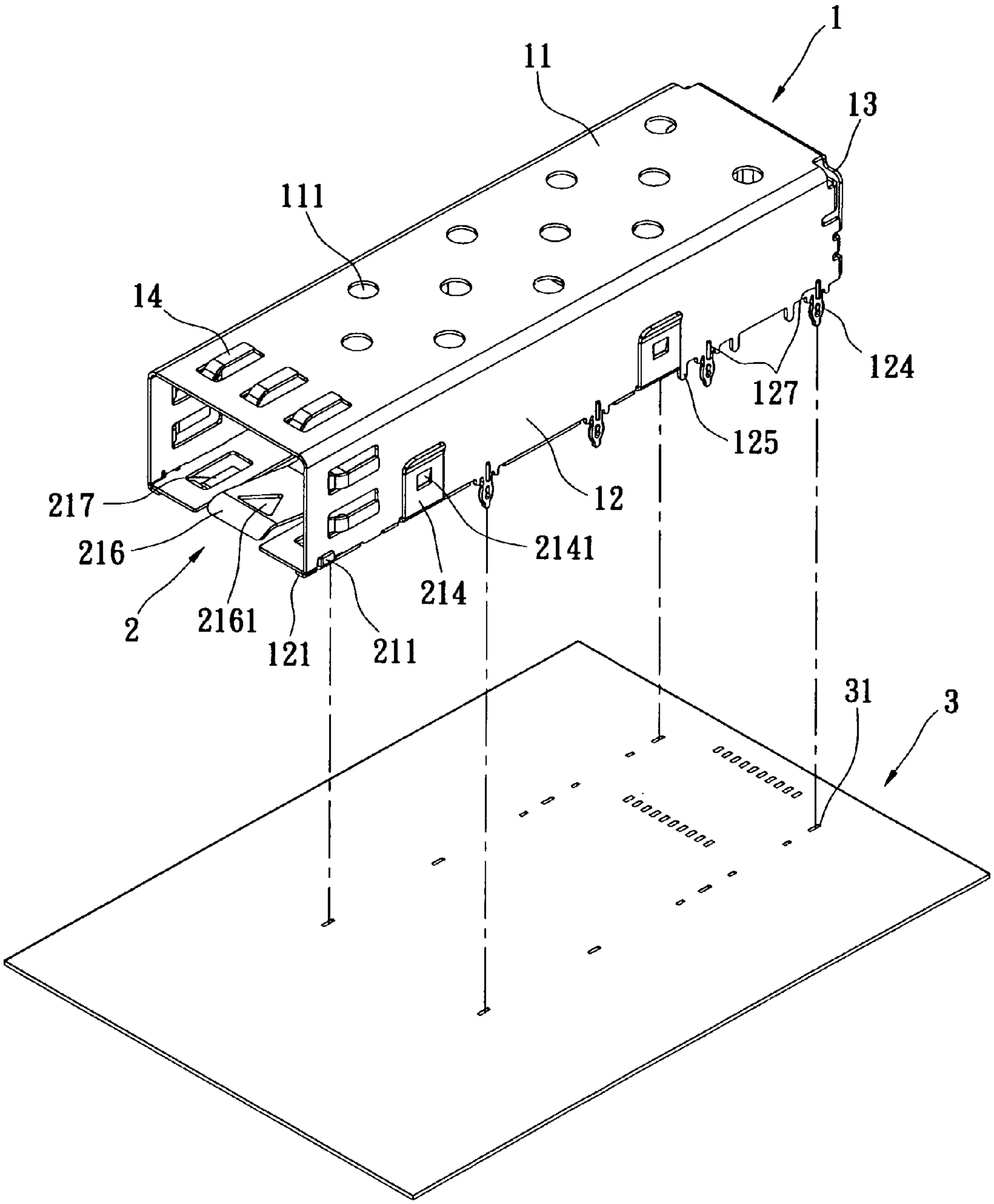
FIG. 6 is a schematic diagram of the connector housing for a small and portable transmitting-receiving module of the present invention being assembled on the printed circuit board.

The side wall 12 is a rectangular metal board. The two side walls 12 extend from the two opposite sides of the top board 11. The lower edge of the two side walls 12 has a first wedging plate 121, a plurality of first convex blocks 122, a plurality of first indentations 123, a plurality of needle-hole pins 124, and a plurality of first wedging pins 125. The first wedging plate 121 extends from the front side of the lower-edge of the two side walls 12. The needle-hole pins 124 each has a needle hole 1241, and two opposite protrusions 1242 are protruded form the needle-hole pins 124 into the needle hole 1241 (please refer to FIG. 2*a*). The needle-hole pins 124, the first wedging pins 125 and the two side walls 12 are located at one common surface. In this embodiment, each of the two side walls 12 has four wedging holes 126. The number of wedging holes 126 is not limited to four. A plurality of reinforcing ribs 127 each straddles the side wall 12 and the needle-hole pin 124. The reinforcing ribs 127 can improve the structural strength of the connector housing upon connection to a printed circuit board 3. The protrusions 1242 can improve the keeping strength as connector housing connected to the printed circuit board 3.

The rear cover 13 is also a rectangular metal board, and extends from the rear side of the top board 1. The rear cover 13 is connected with the two side walls 12. There are two inner convex flexible plates 131 extend from the rear cover 13 and face to the interior of the rear cover 13 so that the small and portable transmitting-receiving module can be easily flipped out of the upper housing 1. In this embodiment, there are three second wedging pins 132 extending from the lower edge of the rear cover 13. The number of second wedging pins 132 is not limited to three.

The first grounding flexible plates 14 are located at the front side of the upper housing 1. The first grounding flexible plates 14 extend to outside of the upper housing 1.

The lower housing 2 is a rectangular metal board. The length of the lower housing 2 is shorter than the length of the upper housing 1. The lower housing 2 has a bottom board 21. The bottom board 21 is a rectangular metal board. At the two opposite sides of the bottom board 21, each has a second wedging plate 211, a plurality of second convex blocks 212, a plurality of second indentations 213, and at least one flexible plate 214. The second wedging plate 211 extends upwards from the front side of the bottom board 21. The second wedging plate 211 leans against the first wedging plate 121. The second wedging plate 211 is wedging the two side walls 12. The second convex blocks 212 are plugged into the first indentations 123. The first convex blocks 122 are plugged into the second indentations 213. Thereby, the lower housing 2 is connected with the upper housing 1.

In this embodiment, there are four flexible plates 214 extending upwards from the two opposite sides of the bottom board 21. The number of flexible plates 214 is not limited to four, and is the same as the number of wedging holes 126. The interior of the flexible plate 214 has a wedging unit 2141. The wedging unit 2141 is engaged with wedging hole 126 so that the lower housing 2 and the upper housing 1 are mutually and firmly wedged together.

There are a plurality of wedging-fitting pins 215 protruding from the exterior of the bottom board 21. At the front side of the bottom board 21, there are a locking flexible plate 216 and two second grounding flexible plates 217. In this embodiment, there are three wedging-fitting pins 215 extending outwards from the middle and the front side of the bottom board 21. The three wedging-fitting pins 215 lean against the printed circuit board 3. The locking flexible plate 216 protrudes inwards from the front side of the bottom board 21. There is a triangular locking opening 2161 on the locking flexible plate 216 for locking and engaging with the small and portable transmitting-receiving module. The two second grounding flexible plates 217 protrude outwards from the bottom board 21. The two second grounding flexible plates 217 are located at the two sides of the locking flexible plate 216. The two second grounding flexible plates 217 and the first grounding flexible plate 14 contact the external ground (not shown in the figure) for sheltering the EMI.

When the connector housing for a small and portable transmitting-receiving module is assembled, the needle-hole pins 124 and the first wedging pins 125 of the upper housing 1 are respectively plugged into the through holes 31 of the printed circuit board 3. The second wedging pins 132 of the rear cover 13 are also plugged into the through holes 31 of the printed circuit board 3. Thereby, the connector housing for a small and portable transmitting-receiving module is fastened onto the printed circuit board 3.

Because the second wedging plate 211 of the lower housing 2 leans against the first wedging plate 121 of the upper housing 1, the second wedging plate 211 is wedging the two side walls 12 of the upper housing 1, the first wedging plate 121 is wedging the bottom board 21 of the lower housing 2, the second convex blocks 212 of the lower housing 2 are plugged into the first indentations 123 of the upper housing 1 and the first convex blocks 122 of the upper housing 1 are plugged into the second indentations 213 of the lower housing 2, the upper housing 1 is tightly connected with the lower housing 2. Therefore, the structure of the connector housing for a small and portable transmitting-receiving module is stronger than connector housings of the prior art. The housing is not easily deformed or damaged due to an improper assembling process or an external force. Its structure is simple, and the manufacturing cost is reduced.

The description above only illustrates specific embodiments and examples of the invention. The invention should therefore cover various modifications and variations made to the herein-described structure and operations of the invention, provided they fall within the scope of the invention as defined in the following appended claims.

What is claimed is:

1. A connector housing for a small and portable transmitting-receiving module, comprising:

an upper housing having a top board, two side walls and a rear cover, wherein the two side walls extend from two opposite sides of the top board, the rear cover extends from rear side of the top board, the rear cover is connected with the two side walls, and lower edges of the two side walls have a first wedging plate, a plurality of first convex blocks, and a plurality of first indentations; and a lower housing having a bottom board, wherein the two opposite sides of the bottom board have a second wedging plate, a plurality of second convex blocks, and a plurality of second indentations, the second wedging plate leans against the first wedging plate and wedges the two side walls, the two first wedging plates wedge the bottom board, the second convex blocks are plugged into the first indentations, and the first convex blocks are plugged into the second indentations, wherein each of the two opposite sides of the bottom board extends upwards to form at least one flexible plate, the interior of the flexible plate has an wedging unit, each of the two side walls has at least one wedging hole, the wedging hole is engaged with the wedging unit, and the lower edge of the two side walls have a plurality of needle-hole pins, a plurality of reinforcing ribs each straddles the side wall and the needle-hole pin.

2. The connector housing for a small and portable transmitting-receiving module as claimed in claim 1, wherein the first wedging plate extends from the front side of the lower edge of the two side walls.

3. The connector housing for a small and portable transmitting-receiving module as claimed in claim 1, wherein the upper housing has a plurality of first grounding flexible plates and a plurality of cooling holes, the first grounding flexible plates being located at the front side of the upper housing, and the cooling holes being located at the top board.

4. The connector housing for a small and portable transmitting-receiving module as claimed in claim 1, wherein the lower edges of the two side walls have a plurality of first wedging pins, and the rear cover has a plurality of second wedging pins.

5. The connector housing for a small and portable transmitting-receiving module as claimed in claim 1, wherein the front side of the bottom board has a locking flexible plate that protrudes inwards and two second grounding flexible plates that protrude outwards, and the two second grounding flexible plates are located at the two sides of the locking flexible plate.

6. The connector housing for a small and portable transmitting-receiving module as claimed in claim 1, wherein the second wedging plate extends upwards from the front side of the bottom board.

7. The connector housing for a small and portable transmitting-receiving module as claimed in claim 1, wherein there are two inner convex flexible plates extending from the rear cover and facing to the interior of the rear cover, and the lower edge of the rear cover has a plurality of second wedging pins.

8. The connector housing for a small and portable transmitting-receiving module as claimed in claim 1, wherein the bottom board extends outwards to form a plurality of wedging-fitting pins.

9. The connector housing for a small and portable transmitting-receiving module as claimed in claim 1, wherein the needle-hole pins each has a needle hole, two opposite protrusions are protruded form the needle-hole pins into the needle hole.

* * * * *